United States Patent [19]

Inoue et al.

[11] 4,025,802

[45] May 24, 1977

[54] CAPACITANCE CIRCUIT

[75] Inventors: Fumihito Inoue, Kodaira; Yoshiji Nakajima, Fuchu; Noboru Horie, Kodaira, all of Japan

[73] Assignee: Hitachi, Ltd., Japan

[22] Filed: July 17, 1975

[21] Appl. No.: 596,764

Related U.S. Application Data

[62] Division of Ser. No. 403,406, Oct. 4, 1973, Pat. No. 3,962,718.

[30] Foreign Application Priority Data

Oct. 4, 1972 Japan .............................. 47-99061

[52] U.S. Cl. ................................ 307/350; 307/351; 307/318; 329/101; 357/13; 357/14

[51] Int. Cl.² ................... H03K 5/20; H01L 29/90; H01L 29/92

[58] Field of Search ............ 307/235 A, 235 R, 318; 329/101, 109, 190, 206; 357/13, 14, 20, 46, 50, 51

[56] References Cited

UNITED STATES PATENTS

| | | | |
|---|---|---|---|
| 2,964,655 | 12/1960 | Mann | 307/318 X |
| 3,118,302 | 1/1964 | Fathaver | 307/318 X |
| 3,402,303 | 9/1968 | Painter | 307/318 X |

*Primary Examiner*—John Zazworsky
*Attorney, Agent, or Firm*—Craig & Antonelli

[57] ABSTRACT

In a capacitance circuit having a capacitance element which exhibits a breakdown characteristic and which generates noises at breakdown, the improvement comprising a constant-voltage element, which has a lower breakdown voltage than the capacitance element and a lower noise level than the capacitance element in the state of breakdown, connected in parallel with the capacitance element. The voltage across the capacitance element is clamped at the breakdown voltage of the constant-voltage element, so that the capacitance element is prevented from breaking down and thus generating noise components.

8 Claims, 15 Drawing Figures

CAPACITANCE CIRCUIT

CROSS REFERENCE TO RELATED APPLICATION

This application is a division of application Ser. No. 403,406 entitled "Capacitance Circuit", filed Oct. 4, 1973, now U.S. Pat. No. 3,962,718.

BACKGROUND OF THE INVENTION

1. Field of the Invention

The present invention relates to a capacitance circuit, and is mainly concerned with the semiconductor junction capacitance in a semiconductor integrated circuit.

2. Description of the Prior Art

Shown in FIG. 1 is an emitter follower type transistor detector circuit for color television having a detecting transistor TR, and time constant circuit C2, R2, in which a filter circuit consisting of a capacitor $C_1$ and a resistance $R_1$ is connected to the collector of a detector transistor TR in order to prevent high frequencies from leaking to a power source $V_{cc}$. In this emitter follower type transistor detector circuit, input signal VIN to be detected in supplied to the base electrode of the detecting transistor, and detected output signal VD is obtained from the emitter electrode of the detecting transistor TR. In case of constructing such a circuit in the form of a semiconductor integrated circuit (hereinbelow termed IC), the capacitor $C_1$ for the filter has hitherto been formed of a large-capacitance semiconductor junction capacitor which is as shown in FIGS 2a or 2b and which makes use of the P-n junction between an $n^+$-type buried region 4 and a $p^+$-type isolated region 5 within a semiconductor substrate member (including layers 1 and 2). With such construction, however, large noises have often arisen.

The reason for such noise has been clarified, and is as stated below. The breakdown voltage of the p-n junction is determined by the impurity concentrations of the $n^+$-type buried region and the $p^+$-type isolated region. When a voltage exceeding the breakdown voltage is applied to the capacitor $C_1$ within the IC, breakdown occurs. In the occurrence of the breakdown, large pulsating noises are generated from the capacitor $C_1$, and the noise characteristic of the IC is degraded. It is generally said that the pulsating noises at the breakdown of the p-n junction are greatly ascribable to the microplasma breakdown which is a non-uniform avalanche phenomenon. The microplasma breakdown starts from a minute breakdown point having a diameter of approximately 1$\mu$, and gives rise to current pulses of approximately 10 - 100 $\mu$A with irregular widths in a transient breakdown region.

The breakdown voltage of the junction capacitor can be raised by lowering the impurity concentrations of the junction portion. In this case, however, the capacitance becomes smaller for an identical elemental area. In other words, in the case where the capacitor having a predetermined capacitance is to be produced, the area of the capacitor becomes larger. This leads to a larger chip area for the whole integrated circuit, and brings about a lowering of the yield of the IC's in the manufacture.

Furthermore, due to the lowering of the impurity concentrations, such parameters as the collector series resistance $r_{sc}$ of the transistor within the semiconductor integrated circuit change, so that various characteristics of the integrated circuit vary undersirably.

The present invention utilizes the idea that the noise level of a Zener diode (for which the emitter-base junction of a transistor is exploited, as illustrated in FIG. 3) is inversely proportional to the density of current flowing through the diode and that it has a characteristic as shown in a curve diagram in FIG. 4 (IEEE JOURNAL OF SOLID-STATE CIRCUITS, December 1971, pp. 366–376, "Five-Terminal $\pm$ 15V Monolithic Regulator"). More particularly, a Zener diode having a Zener voltage lower than the breakdown voltage of the p-n junction capacitor is connected in parallel with the semiconductor junction capacitor, whereby the breakdown of the junction capacitor is prevented to thus avoid the generation of noise from the capacitor. In addition, the junction area is made small, whereby suppression of the noise level of the Zener diode is accomplished.

SUMMARY OF THE INVENTION

An object of the present invention is to prevent noises from arising at breakdown of a semiconductor junction capacitor.

Another object is to enhance the yield in the manufacture of semiconductor IC's.

The construction of the present invention for accomplishing the objects is characterized in a capacitance circuit including a capacitance element having a breakdown characteristic and generating noises at breakdown and a constant-voltage element having a lower breakdown voltage than the capacitance element connected in parallel therewith, the constantvoltage element being held biased in a breakdown region.

PREFERRED EMBODIMENTS OF THE INVENTION

Figure 5A:
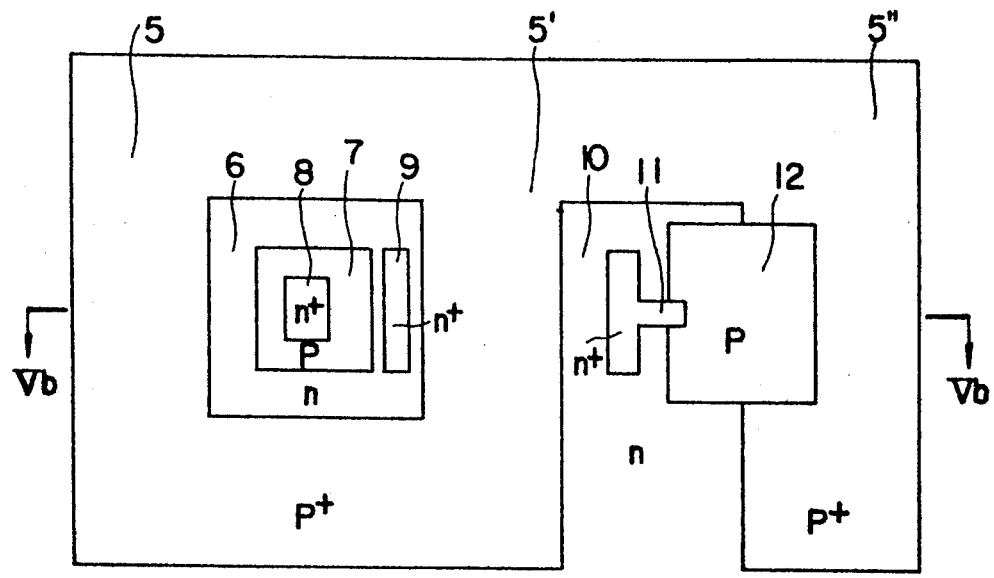
FIGS. 5a and 5b show the fundamental embodiment of the present invention, in which FIG. 5 a is a plan view and FIG. 5 b a vertical sectional view.
Figure 5B:
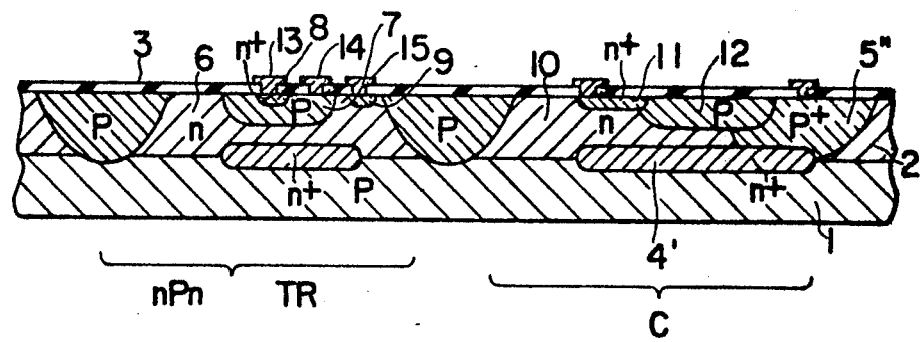
Figure 6:
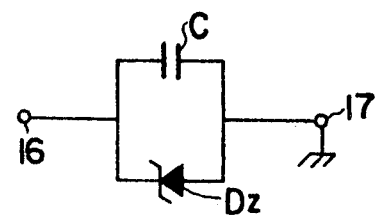
FIG. 6 is an equivalent circuit diagram of a part of the embodiment.

FIGS. 5 a and 5 b illustrate an embodiment of the present invention. Within a substrate member consisting of a p-type semiconductor substrate 1 and an n-type epitaxial semiconductor layer 2, a semiconductor junction capacitance C is constructed of the electrostatic capacitance of the depletion layer of the p-n junction owing to an $n^+$-type buried region 4' and a part 5'' of a $p^+$-type isolated region 5. At the surface of the n-type semiconductor layer 2, a Zener diode $D_z$ is constructed of the p-n junction of small junction area (10 $\times$ 20 $\mu^2$ or so) between a p-type region 12 formed simultaneously with the base diffusion and an n⁺-type region 11 formed simultaneously with the emitter diffusion. Thus, the semiconductor junction capacitor C and the Zener diode $D_Z$ are equivalently connected in parallel as illustrated in FIG. 6. In FIGS. 5 and 6, reference numeral 3 designates an $SiO_2$ surface-protecting film, 6 a collector region, 7 a base region, 8 an emitter region, 9 a collector n⁺ contact, 13 an emitter electrode 14 a base electrode, 15 a collector electrode, and 16 and 17 capacitor electrodes.

The Zener diode $D_Z$ uses as its Zener voltage $V_Z$ the reverse withstand voltage between the diode n⁺ contact 11 and the diffused p-type region 12.

Figure 1:
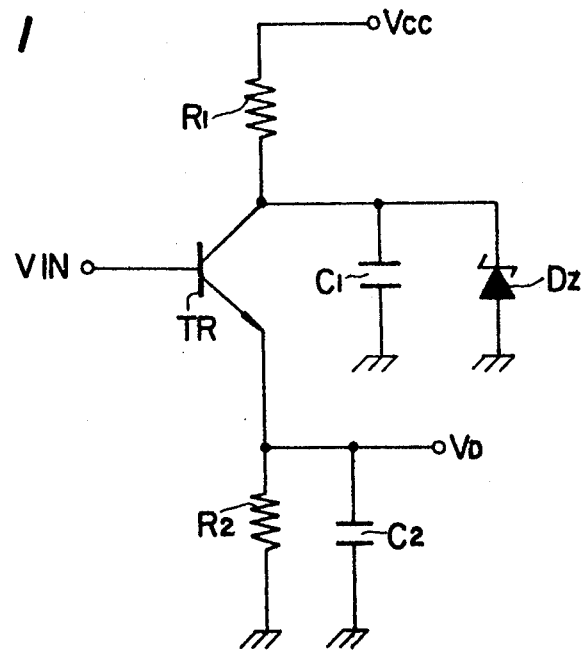
FIG. 1 is a circuit diagram showing an example of a highfrequency by-pass filter circuit.
Figure 2A:
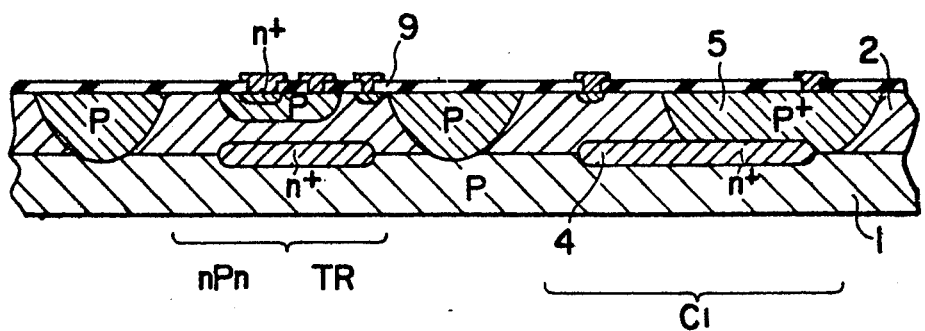
FIGS. 2a and 2b are vertical sectional views each showing a semiconductor IC into which the circuit arrangement in FIG. 1 is formed.
Figure 2B:
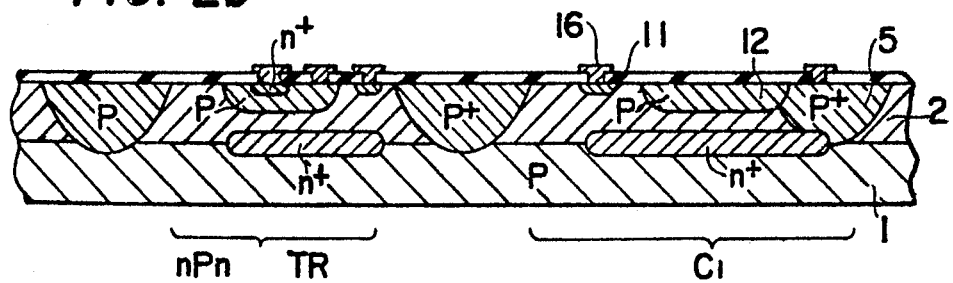
Figure 3:
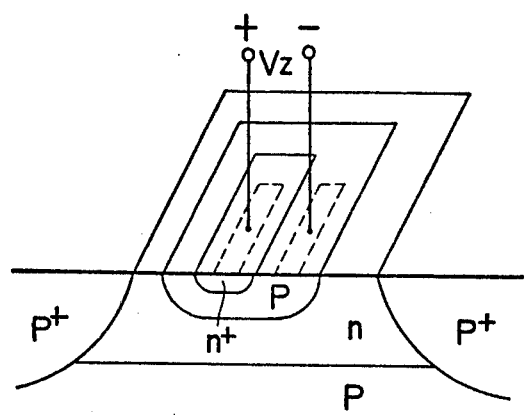
FIG. 3 is a perspective sectional view of a Zener diode, illustrating the principle of the present invention.
Figure 4:
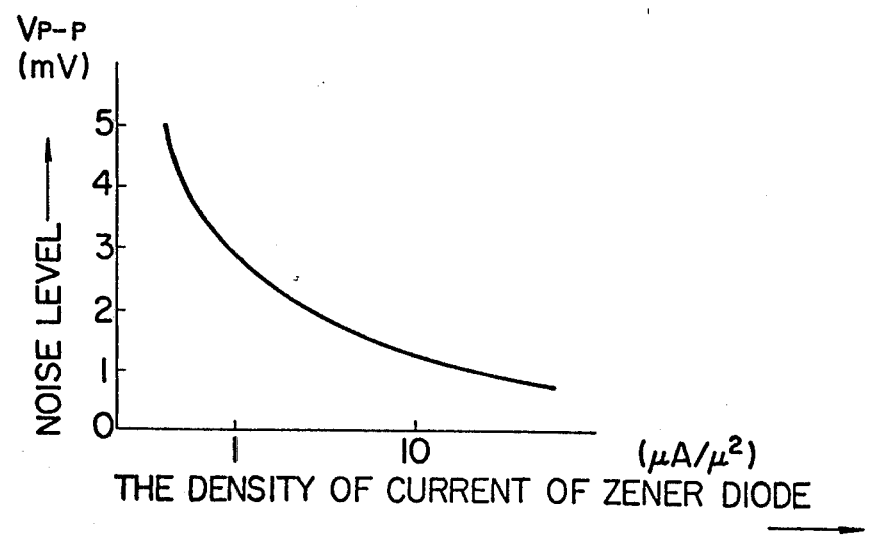
FIG. 4 is a curve diagram of the noise level characteristic of a Zener diode.

The Zener diode in this embodiment is constructed in such a way that a diode n⁺ contact 11 in FIG. 2 b is extended to form a p-n junction along with a diode p-type region 12.

Since, as seen in FIG. 5 a, the p⁺-type isolated region 5 is grounded, the capacitor terminal 17 is also grounded. Accordingly, the capacitor is employed as a grounding capacitor. In the embodiment, the Zener current density is made approximately $1 \times 10^6$ mA/cm² in order to suppress the noise level of the Zener diode.

Constituent capacitive components $C_1$ to $C_3$ of the semiconductor junction capacitor (or grounding capacitor) C have the following relation:

$C \cong C_1 + C_2 + C_3$ (subject to $C_1 > C_2$)

$C_1$ : Junction capacitance owing to the n⁺-type buried region 4′ and the p⁺-type isolated region 5″.

$C_2$ : Junction capacitance owing to an epitaxial n-type region 10 and the diffused p-type region 12.

$C_3$ : Junction capacitance owing to the n⁺ contact region 11 and the p-type region 12.

In accordance with the construction of the present invention as described above, the objects can be accomplished as stated below.

(1) Regarding the prevention of noises. In the IC's, the breakdown voltages of the p-n junctions each formed of the p⁺-type isolated region and the n⁺-type buried region have a non-uniform distribution to the extent of 8−15 V. On the other hand, the breakdown voltages of the junctions each constructed of the emitter n⁺ diffused region and the base p-type diffused region have a non-uniform distribution to the extent of 6.5 − 8 Accordingly, the breakdown voltage of the semiconductor junction capacitor constructed of the n⁺-type buried region and the p⁺-type isolated region, as seen in FIGS. 5 a and 5 b, becomes higher than the Zener breakdown voltage of the Zener diode constructed of the n⁺ region formed at the emitter diffusion and the p-type region formed at the base diffusion. As already described, the equivalent circuit of the element construction of the semiconductor junction capacitor C and the Zener diode $D_Z$ in FIGS. 5 a and 5 b is as shown in FIG. 6, and the elements are in the parallel connection.

Since the area of the junction of the Zener diode between the n⁺-type region and the p-type region is small, the Zener current density is sufficiently large. Therefore, the noise level of the Zener diode in its breakdown region hardly comes into question.

Further, the semiconductor junction capacitor has the Zener diode connected in parallel therewith, so that the voltage across the junction capacitor is clamped at the Zener voltage lower than the breakdown voltage of the capacitor. Consequently, the semiconductor junction capacitor is never brought into breakdown. Therefore, the noises which seem to be caused by the microplasma are not generated.

(2) Regarding the manufacturing process, for the reasons set forth in item (1) above, the IC's manufactured according to this invention have an improved noise characteristic, and can lower the percentage of defects attributable to non-conforming noise characteristics. In the manufacture of the semiconductor IC's, the yield is enhanced.

In consequence, the present invention produces various effects, as stated below.

(1) The element area does not increase. In accordance with the prior art, for the prevention of the noises at the breakdown of the junction capacitor only the method in which the breakdown voltage of the junction is raised so as to avoid the junction capacitor from breaking down has been relied upon. In order to raise the breakdown voltage of the semiconductor junction capacitor of the semiconductor IC, the impurity in the vicinity of the junction need be lowered, so that the capacitance to the unit area of the semiconductor is inevitably lowered. Accordingly, in case of manufacturing a semiconductor junction capacitor which has an identical capacitance and a higher breakdown voltage, it is naturally required to increase the junction area.

In contrast, in accordance with the system of the present invention, the noises at the breakdown of the junction capacitor can be prevented without raising the breakdown voltage of the semiconductor junction capacitor. It is therefore unnecessary to lower the impurity concentrations and to increase the junction area. Accordingly, the increase of the chip area of the semiconductor IC as is ascribable to the increase of the junction area of the semiconductor junction capacitor is avoidable.

The increase of the chip area of the semiconductor IC is a serious problem in the manufacture. A rise in cost due to decrease in the number of chips acquired from a single wafer is not the only disadvantage In proportion to the chip area, defects within the chip increase, and nonconforming articles increase. Thus, a lowering in the yield in the manufacture of the semiconductor IC's is induced.

(2) The number of manufacturing steps does not increase. As apparent from FIGS. 5 a and 5 b , the Zener diode is constructed of the p-type region and the n⁺-type region within the IC, the former region being formed simultaneously with the base diffusion for the transistor and the latter region being formed simultaneously with the emitter diffusion. It does not require any special process, and does not increase the number of manufacturing steps.

(3) The characteristics of the IC are enhanced. The rise of the breakdown voltage of the semiconductor junction capacitor is realized by lowering the impurity concentrations in the vicinity of the junction as has been stated previously. This, however, induces undesired changes in the characteristics of the IC, etc. The changes in the characteristics of the IC, etc. in the case of lowering the impurity concentration of the n⁺-type buried region and in the case of lowering the impurity concentration of the p⁺-type isolated region, are as below.

(A) Lowering of the impurity concentration of the n⁺-type buried region.

The purpose of the provision of the n⁺-type buried region is to reduce the collector series resistance $r_{sc}$ of the transistor within the IC. Accordingly, the lowering of the impurity concentration of the n⁺ buried region results in a higher $r_{sc}$, and brings about degradations in transistor characteristics as follows:

a. Increase in the collector-emitter saturation voltage $V_{CE}$ (Sat).

b. Lowering in the cutoff frequency $f_T$.

B. Lowering of the impurity concentration of the p⁺-type isolated region.

The depth of a diffused layer is affected by the surface impurity concentration and the diffusion time. Accordingly, in case of lowering the impurity concentration of the p⁺-type diffusion, a diffusion of long duration is required for the p⁺-type isolation region to get to the p-type semiconductor substrate. When dispersions of the epitaxial layers in thickness and in concentration are considered, it is feared that the isolated region will not get to the substrate. It is feared that products of imperfect element isolation will appear to induce lowering in the manufacturing yield.

In contrast, in accordance with the system of the present invention, in raising the breakdown voltage of the semiconductor junction capacitor, the impurity concentrations of the n⁺-type buried region and the p⁺-type isolated region need not be lowered, and the manufacturing process may be quite the same as in the prior art. Therefore, a diffusion of long duration as stated above is unnecessary, and the lowering of the characteristics of the IC is not brought about.

In addition to the foregoing embodiment, the present invention has various aspects of performance as described below.

Figure 7A:
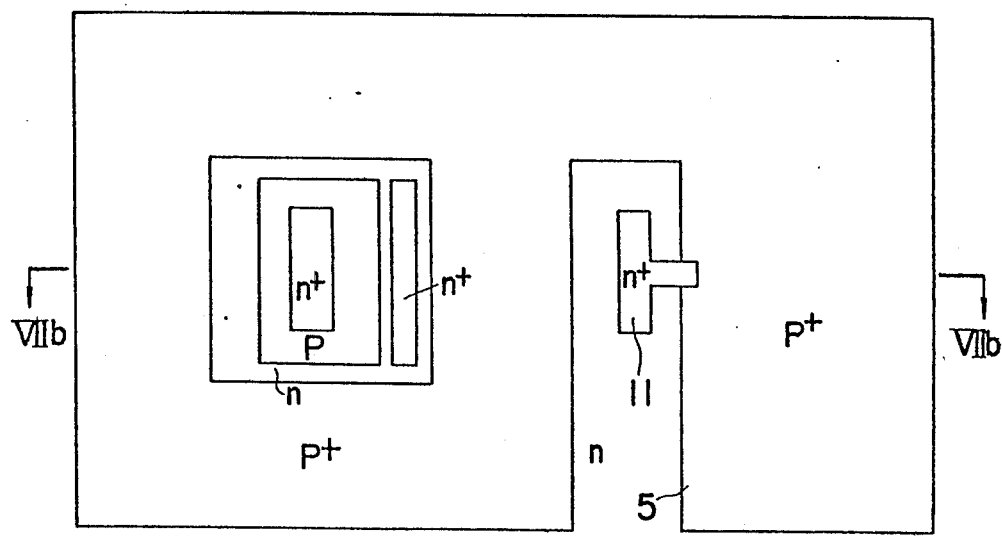
FIGS. 7 a and 7 b and FIGS. 8 a and 8 b show further embodiments of the present invention in which the respective FIGS. 7 a and 8a are plan views of FIGS. 7b and 8b vertical sectional views; a FIGS. 9 to 11 are vertical sectional views showing still further embodiments.
Figure 7B:
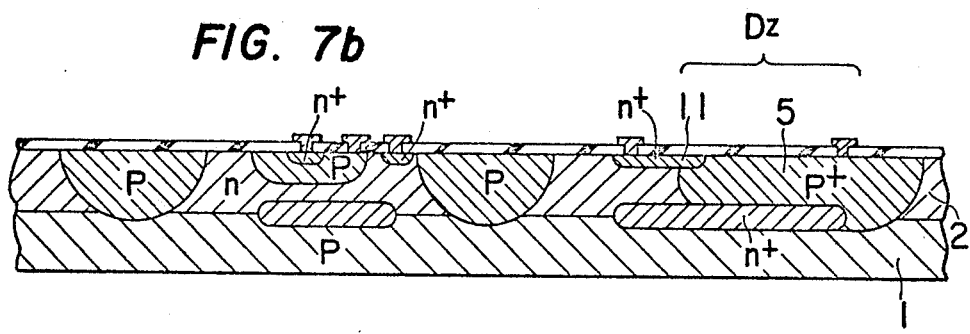

(1) As shown in FIGS. 7 a and 7 b, the Zener diode $D_z$ is constructed of the p⁺-type isolated region 5 and the n⁺-type region 11 which is formed at the diffusion of the emitter region 8.

Figure 8A:
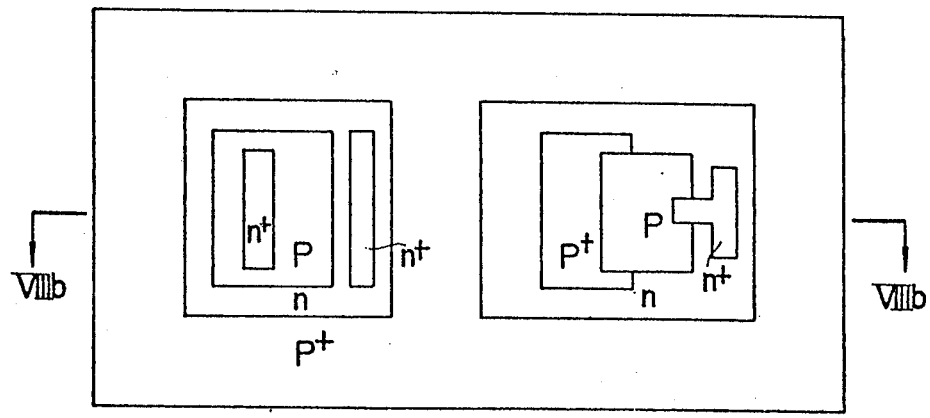
Figure 8B:
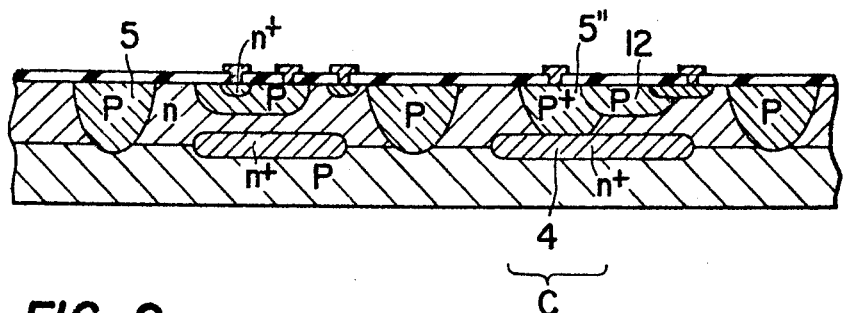

(2) As shown in FIGS. 8 a and 8 b, the p⁺ layer 5″ in the semiconductor junction capacitor C is formed separately from the isolated region 5. It is made usable under the state in which it is not grounded.

Figure 9:
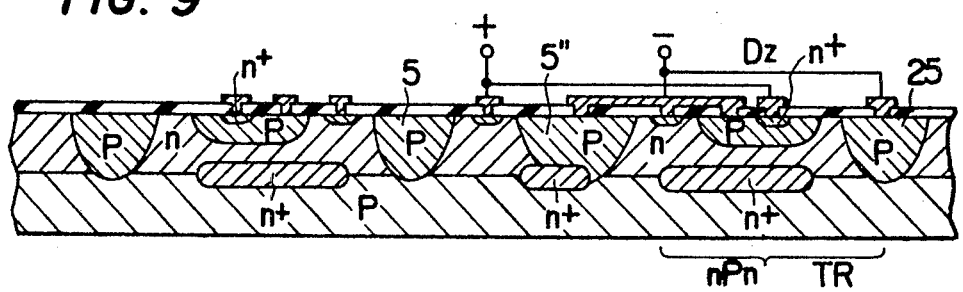
Figure 10:
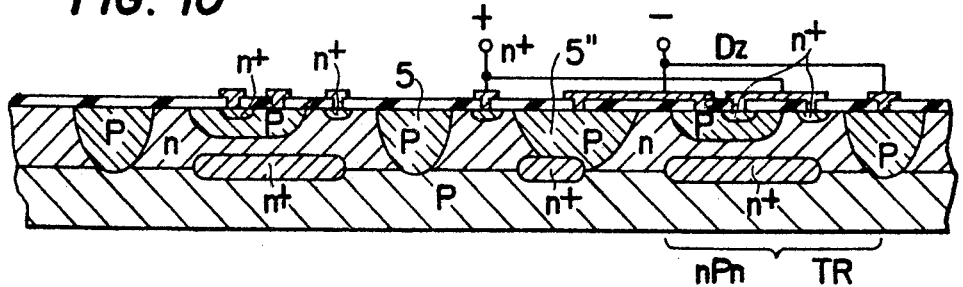

(3) As illustrated in FIGS. 9 and 10, the junction between the p⁺ layer 5″ and n⁺-type buried region is utilized as the junction capacitor and, the base emitter-junction of an n-p-n transistor is utilized as the Zener diode, and this junction capacitor and Zener diode are electrically connected in parallel.

Figure 11:
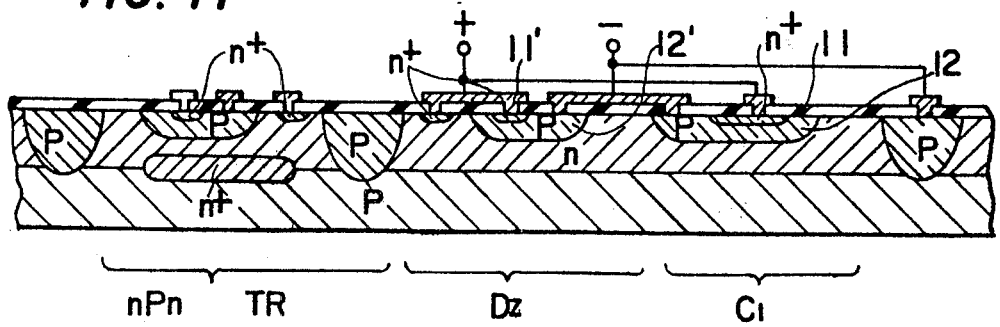

(4) As illustrated in FIG. 11, the semiconductor junction capacitor is constructed using the n⁺-type region 11 formed at the emitter diffusion for the transistor and the p-type region 12 is formed at the base diffusion, while the Zener diode is constructed using an n⁺-type region 11′ formed at the emitter diffusion and a p-type region 12′ diffused at a higher concentration than in the base diffusion, and this junction capacitor and Zener diode are electrically connected in parallel also.

(5) The present invention is not restricted to IC's. The capacitor can be substituted by any capacitance element which generates noises at breakdown. The Zener diode can be substituted by any constant-voltage element whose breakdown voltage is lower than that of the capacitance element and whose noise level is lower than that of the capacitance element at least at a part of the breakdown region thereof.

The present invention is applicable to all sorts of capacitance circuits except the case of a coupling capacitor for blocking a DC current. Since the capacitor in the present invention has the Zener diode connected in parallel therewith, D.C. components flow through the Zener diode.

The present invention is also utilized for a capacitor which serves to hold a DC voltage and to cause a high-frequency current to flow therethrough in a high-frequency by-pass filter circuit or the like.

While We have shown and described several embodiments in accordance with the present invention, it is understood that the same is not limited thereto but is susceptible of numerous changes and modifications as known to a person skilled in the art, and We therefore do not wish to be limited to the details shown and described herein but intend to cover all such changes and modifications as are obvious to one of ordinary skill in the art.

We claim:

1. A capacitance circuit comprising a pn-junction capacitance element having a breakdown characteristic and which generates noise signal components at breakdown, and a pn-junction Zener diode whose breakdown voltage is lower than that of said pn-junction capacitance element and whose noise characteristic is preferable to that of said pn-junction capacitance element, said pn-junction capacitance element and said pn-junction Zener diode being connected in parallel with each other, and wherein said pn-junction Zener diode forms a by-pass for the noise signal components which are generated from said pn-junction capacitance element by breakdown thereof, wherein said capacitance circuit is fabricated as a semiconductor integrated circuit.

2. A transistor circuit comprising a transistor having base, emitter and collector electrodes, a resistor connected between said collector electrode and a bias voltage source, a circuit means connected between said emitter electrode and ground, a filter circuit connected between said collector electrode and ground including a pn-junction capacitor and a pn-junction Zener diode connected in parallel, said pn-junction Zener diode having a breakdown voltage which is lower than the breakdown voltage of said pn-junction capacitor and noise characteristics which are preferable to those of said pn-junction capacitor, both the pn-junctions of said pn-junction capacitor and said pn-junction Zener diode being reverse-biased at a voltage below the breakdown voltage of said pn-junction Zener diode, and means for supplying an A.C. signal to the base electrode of said transistor, wherein said pn-junction Zener diode forms a by-pass for the noise signal components which are generated from said pn-junction capacitor when the voltage of said A.C. signal appearing at said collector electrode added to said voltage reverse-biasing said pn-junctions attains a voltage value higher than the breakdown voltage of said pn-junction capacitor.

3. A transistor circuit as defined in claim 2, wherein said pn-junction Zener diode is formed by the base-emitter junction of a further transistor.

4. The combination according to claim 2, wherein said transistor circuit is fabricated as a semiconductor integrated circuit.

5. In a transistor detector circuit comprising a detecting transistor having base, emitter and collector electrodes, a resistor connected between said collector electrode and a bias voltage source, a time constant circuit connected between said emitter electrode and ground, a filter circuit connected between said collector electrode and ground, an input terminal connected to said base electrode for supplying an input signal to be detected, and an output terminal connected to said emitter electrode for deriving an output signal, the improvement wherein said filter circuit includes a pn-junction capacitor and a pn-junction Zener diode connected in parallel, said pn-junction Zener diode having a breakdown voltage which is lower than the breakdown voltage of said pn-junction capacitor and noise characteristics which are preferable to those of said pn-junction capacitor, both the pn-junctions of said pn-junction capacitor and said pn-junction Zener diode being reverse-biased at a voltage below the breakdown voltage of said pn-junction Zener diode, and said pn-junction Zener diode forms a by-pass for the noise signal components which are generated from said pn-junction capacitor when the voltage of said input signal appearing at said collector electrode added to said voltage reverse-biasing said pn-junctions attains a voltage value higher than the breakdown voltage of said pn-junction capacitor.

6. A capacitance circuit comprising a pn-junction capacitance element having a breakdown characteristic and which generates noise signal components at breakdown, a pn-junction Zener diode connected in parallel with said pn-junction capacitance element, said pn-junction Zener diode having a breakdown voltage lower than that of said pn-junction capacitance element and having noise characteristics preferable to that of said pn-junction capacitance element, bias means for reverse-biasing both the pn-junctions of said pn-junction capacitance element and said pn-junction Zener diode at a voltage lower than the breakdown voltage of said pn-junction Zener diode, and means for supplying an A. C. signal across said pn-junction capacitance element and said pn-junction Zener diode, wherein said pn-junction Zener diode forms a by-pass for the noise signal components which are generated from said pn-junction capacitance element when the voltage of said A. C. signal applied to said pn-junction capacitance element added to the voltage of said bias means applied thereto attains a voltage value higher than the breakdown voltage of said pn-junction capacitance element.

7. In a detector circuit comprising:

an input terminal to which an input signal is applied;

a bias terminal to which a bias voltage is applied;

an output terminal;

a detector element connected between said input and output terminals and being coupled to said bias terminal and a filter circuit connected to said detector element for preventing high frequency signals from being coupled to said bias terminal, said filter circuit including a pn-junction capacitor having a prescribed breakdown characteristic and which generates noise signal components at breakdown;

the improvement wherein said filter circuit further includes means, connected in parallel with said pn-junction capacitor, for by-passing noise signal components generated at the pn-junction of said capacitor, said means comprising a pn-junction Zener diode having a breakdown voltage lower than that of said pn-junction capacitor.

8. The improvement according to claim 7, wherein said detector element comprises a transistor, the base of which is connected to said input terminal, the emitter of which is connected to said output terminal, and the collector of which is coupled to said bias terminal, said pn-junction Zener diode by-passing noise signal components which are generated by said pn-junction capacitor, upon the voltage value of the signal which appears at the collector of said transistor, added to the voltage from said bias terminal reverse-biasing the pn-junctions of said capacitor and Zener diode, exceeding the breakdown voltage of said pn-junction capacitor.

* * * * *